US009143039B2

United States Patent
Yang et al.

(10) Patent No.: US 9,143,039 B2
(45) Date of Patent: Sep. 22, 2015

(54) SYSTEMS AND METHODS FOR REDUCING ELECTROMAGNETIC INTERFERENCE BY ADJUSTING SWITCHING PROCESSES

(71) Applicant: ON-BRIGHT ELECTRONICS (SHANGHAI) CO., LTD., Shanghai (CN)

(72) Inventors: Dongze Yang, Shanghai (CN); Miao Li, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 72 days.

(21) Appl. No.: 13/779,583

(22) Filed: Feb. 27, 2013

(65) Prior Publication Data

US 2014/0233271 A1    Aug. 21, 2014

(30) Foreign Application Priority Data

Feb. 19, 2013    (CN) .......................... 2013 1 0053020

(51) Int. Cl.
*H02M 3/335*    (2006.01)
*H02M 1/08*    (2006.01)
*H03K 17/16*    (2006.01)

(52) U.S. Cl.
CPC ............ *H02M 3/33515* (2013.01); *H02M 1/08* (2013.01); *H02M 3/33523* (2013.01); *H03K 17/162* (2013.01)

(58) Field of Classification Search
CPC ... H02M 3/33515; H02M 1/08; H03K 17/162
USPC ..................... 363/21.12, 21.13, 21.17, 21.18; 323/283
See application file for complete search history.

(56) References Cited

U.S. PATENT DOCUMENTS

| 7,471,121 B2 * | 12/2008 | Yang et al. ..................... 327/108 |
| 8,064,231 B2 * | 11/2011 | Fang et al. ................. 363/21.18 |
| 8,098,502 B2 * | 1/2012 | Mao et al. .................. 363/21.03 |
| 8,416,596 B2 * | 4/2013 | Huang ............................. 363/97 |

(Continued)

FOREIGN PATENT DOCUMENTS

| CN | 101207336 | 6/2008 |
| CN | 101282078 | 10/2008 |

(Continued)

OTHER PUBLICATIONS

Chinese Patent Office, Office Action mailed Aug. 21, 2014, in Application No. 201310053020.0.

(Continued)

*Primary Examiner* — Emily P Pham
(74) *Attorney, Agent, or Firm* — Jones Day

(57)    ABSTRACT

System and method for regulating a power conversion system. An example system controller for regulating a power conversion system includes a signal generator and a driving component. The signal generator is configured to receive a feedback signal associated with an output signal of a power conversion system and a current sensing signal associated with a primary current flowing through a primary winding of the power conversion system and generate a modulation signal based on at least information associated with the feedback signal and the current sensing signal. The driving component is configured to receive the modulation signal and output a drive signal to a switch based on at least information associated with the modulation signal.

30 Claims, 7 Drawing Sheets

(56) References Cited

U.S. PATENT DOCUMENTS

| | | | |
|---|---|---|---|
| 8,570,771 B2 * | 10/2013 | Huang et al. | 363/21.12 |
| 2003/0107356 A1 | 6/2003 | Hachiya | |
| 2008/0205099 A1 * | 8/2008 | Chung et al. | 363/59 |
| 2008/0224738 A1 * | 9/2008 | Bodano et al. | 327/109 |
| 2010/0165676 A1 | 7/2010 | Fang et al. | |
| 2010/0172160 A1 * | 7/2010 | Ye et al. | 363/21.18 |
| 2011/0019446 A1 | 1/2011 | Wu et al. | |
| 2011/0110123 A1 | 5/2011 | Li et al. | |
| 2012/0195076 A1 * | 8/2012 | Zhang et al. | 363/21.12 |
| 2013/0051089 A1 * | 2/2013 | Pan et al. | 363/21.17 |

FOREIGN PATENT DOCUMENTS

| | | |
|---|---|---|
| CN | 101127495 | 4/2010 |
| CN | 201479093 | 5/2010 |
| TW | M346985 | 12/2008 |

OTHER PUBLICATIONS

Chinese Patent Office, Office Action mailed Jan. 16, 2015, in Application No. 201310053020.0.

Taiwan Patent Office, Office Action mailed Oct. 6, 2014, in Application No. 102113651.

* cited by examiner

US 9,143,039 B2

SYSTEMS AND METHODS FOR REDUCING ELECTROMAGNETIC INTERFERENCE BY ADJUSTING SWITCHING PROCESSES

1. CROSS-REFERENCES TO RELATED APPLICATIONS

This application claims priority to Chinese Patent Application No. 201310053020.0, filed Feb. 19, 2013, commonly assigned, incorporated by reference herein for all purposes.

2. BACKGROUND OF THE INVENTION

The present invention is directed to integrated circuits. More particularly, the invention provides a system and method for reducing electromagnetic interference (EMI). Merely by way of example, the invention has been applied to power conversion systems. But it would be recognized that the invention has a much broader range of applicability.

With the development of modern electronic technology, more and more electronic devices often operate in a same working environment. In some circumstances, the electronic devices are usually placed very close to each other, and thus problems of electromagnetic interference (EMI) may become severe. Many countries around the world issue standards for electromagnetic compatibility, and electromagnetic compatibility is often deemed as indicating product quality.

Power conversion systems are widely used for consumer electronics (e.g., portable devices) because of the advantages of the power conversion systems such as small sizes, light weight, and high efficiency. FIG. 1 is a simplified diagram showing a conventional switch-mode conversion system. A switch-mode conversion system 100 includes a system controller 180, a switch 140, resistors 150, 154 and 156, capacitors 152, 158 and 166, a primary winding 160, a secondary winding 162, a diode 164, and an isolated feedback component 168. The system controller 180 includes a comparator 110, a modulation component 120, a logic control component 122, a driving component 130, and a leading-edge-blanking (LEB) component 132. The system controller 180 further includes terminals 172, 174, 176, and 178.

For example, the modulation component 120 receives a feedback signal 116 from the isolated feedback component 168 and generates a modulation signal 118. The logic control component 122 receives the modulation signal 118 and outputs a signal 124, which is received by the driving component 130. The driving component 130 outputs a signal 134 through the terminal 172 (e.g., terminal Gate) to close (e.g., turn on) or open (e.g., turn off) the switch 140. The switch-mode power conversion system 100 dynamically adjusts the duty cycle of the switch 140 according to the output load in order to achieve a stable output voltage 170.

In another example, the comparator 110 receives and compares an over-current threshold signal 112 (e.g., $V_{th\_oc}$) and a current sensing signal 114 (e.g., $V_{CS}$), and sends an over-current control signal 116 to the logic control component 122. When the current of the primary winding is greater than a limiting level, the logic control component 122 outputs the signal 124 in order to open (e.g., turns off) the switch 140 and shut down the switch-mode power conversion system 100.

FIG. 2 is a simplified diagram showing the conventional driving component 130 as part of the switch-mode conversion system 100. As shown in FIG. 2, the driving component 130 includes NAND gates 202 and 206, NOT gates 204 and 208, and two transistors 210 and 212. For example, the transistor 210 is a P-channel field effect transistor (FET), and the transistor 212 is an N-channel FET.

If the signal 124 from the logic control component 122 is at a logic low level, the NAND gate 202 outputs a signal 214 at a logic high level, and the NAND gate 206 outputs a signal 216 at a logic low level. The NOT gate 208 receives the signal 216 and outputs a signal 218 at the logic high level. The transistor 212 is turned on in response to the signal 218 being at the logic high level. The transistor 210 is turned off in response to the signal 214 being at the logic high level. The signal 134 at the terminal 172 (e.g., terminal Gate) is at the logic low level so that the switch 140 is open (e.g., being turned off).

On the other hand, if the signal 124 from the logic control component 122 is at the logic high level, the NAND gate 206 outputs the signal 216 at the logic high level and the NAND gate 202 outputs the signal 214 at the logic low level. The NOT gate 208 outputs the signal 218 at the logic low level. The transistor 212 is turned off in response to the signal 218 being at the logic low level. The transistor 210 is turned on in response to the signal 214 being at the logic low level. The signal 134 at the terminal 172 (e.g., terminal Gate) is at the logic high level so that the switch 140 is closed (e.g., being turned on).

Strong EMI may be generated during the processes of turning on and turning off the switch 140 which is one of the main sources of EMI in the system 100. Some measures may be taken to reduce EMI, such as using a complicated noise filter, connecting an absorption apparatus in parallel, adopting a resonance technology, and implementing an advanced protection shield, but all of these measures usually increase system costs and scales. In addition, frequency jittering can be used to reduce EMI. Frequency jittering may improve conductive EMI, but often cannot effectively reduce radiative EMI. Hence it is highly desirable to improve techniques for reducing EMI.

3. BRIEF SUMMARY OF THE INVENTION

The present invention is directed to integrated circuits. More particularly, the invention provides a system and method for reducing electromagnetic interference (EMI). Merely by way of example, the invention has been applied to power conversion systems. But it would be recognized that the invention has a much broader range of applicability.

According to one embodiment, a system controller for regulating a power conversion system includes a signal generator and a driving component. The signal generator is configured to receive a feedback signal associated with an output signal of a power conversion system and a current sensing signal associated with a primary current flowing through a primary winding of the power conversion system and generate a modulation signal based on at least information associated with the feedback signal and the current sensing signal. The driving component is configured to receive the modulation signal and output a drive signal to a switch based on at least information associated with the modulation signal. The driving component is further configured to, if the modulation signal changes from a first logic level to a second logic level, change the drive signal in magnitude from a first magnitude value to a second magnitude value during a first time period in order to close the switch, the first time period being larger than zero.

According to another embodiment, a system controller for regulating a power conversion system includes a signal generator and a driving component. The signal generator is configured to receive a feedback signal associated with an output signal of a power conversion system and a current sensing signal associated with a primary current flowing through a primary winding of the power conversion system and generate a modulation signal based on at least information associated with the feedback signal and the current sensing signal. The driving component is configured to receive the modulation signal and output a drive signal to a switch based on at least information associated with the modulation signal. The driving component is further configured to, if the modulation signal changes from a first logic level to a second logic level, change the drive signal in magnitude from a first magnitude value to a second magnitude value during a time period in order to open the switch, the time period being larger than zero.

According to yet another embodiment, a driving component for outputting a drive signal to a switch coupled to a primary winding of a power conversion system includes a first diode including a first diode terminal and a second diode terminal, a second diode including a third diode terminal and a fourth diode terminal, a capacitor including a first capacitor terminal and a second capacitor terminal, a current source component including a first source terminal and a second source terminal, and a first transistor including a first transistor terminal, a second transistor terminal, and a third transistor terminal. The second source terminal is coupled to the first transistor terminal. The third transistor terminal is coupled to the first diode terminal. The second diode terminal is coupled to the third diode terminal and the first capacitor terminal. The second capacitor terminal is coupled to the fourth diode terminal.

According to yet another embodiment, a driving component for outputting a drive signal to a switch coupled to a primary winding of a power conversion system includes, an AND gate component including a first input terminal, a second input terminal and a first output terminal, a comparator including a third input terminal, a fourth input terminal and a second output terminal, a first transistor including a first transistor terminal, a second transistor terminal and a third transistor terminal, and a second transistor including a fourth transistor terminal, a fifth transistor terminal and a sixth transistor terminal. The first transistor terminal is coupled to the first input terminal. The second transistor terminal is coupled to the fifth transistor terminal. The third transistor terminal is coupled to the sixth transistor terminal. The fourth transistor terminal is coupled to the first output terminal. The second output terminal is coupled to the second input terminal.

In one embodiment, a method for regulating a power conversion system includes, receiving a feedback signal associated with an output signal of a power conversion system and a current sensing signal associated with a primary current flowing through a primary winding of the power conversion system, processing information associated with the feedback signal and the current sensing signal, and generating a modulation signal based on at least information associated with the feedback signal and the current sensing signal. Further, the method includes receiving the modulation signal, processing information associated with the modulation signal, and outputting a drive signal to a switch based on at least information associated with the modulation signal. The process for outputting a drive signal to a switch based on at least information associated with the modulation signal includes, if the modulation signal changes from a first logic level to a second logic level, changing the drive signal in magnitude from a first magnitude value to a second magnitude value during a time period in order to close the switch, the time period being larger than zero.

In another embodiment, a method for regulating a power conversion system includes, receiving a feedback signal associated with an output signal of a power conversion system and a current sensing signal associated with a primary current flowing through a primary winding of the power conversion system, processing information associated with the feedback signal and the current sensing signal, and generating a modulation signal based on at least information associated with the feedback signal and the current sensing signal. Further, the method includes, receiving the modulation signal, processing information associated with the modulation signal, and outputting a drive signal to a switch based on at least information associated with the modulation signal. The process for outputting a drive signal to a switch based on at least information associated with the modulation signal includes, if the modulation signal changes from a first logic level to a second logic level, changing the drive signal in magnitude from a first magnitude value to a second magnitude value during a time period in order to open the switch, the time period being larger than zero.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to integrated circuits. More particularly, the invention provides a system and method for reducing electromagnetic interference (EMI). Merely by way of example, the invention has been applied to power conversion systems. But it would be recognized that the invention has a much broader range of applicability.

Figure 1:
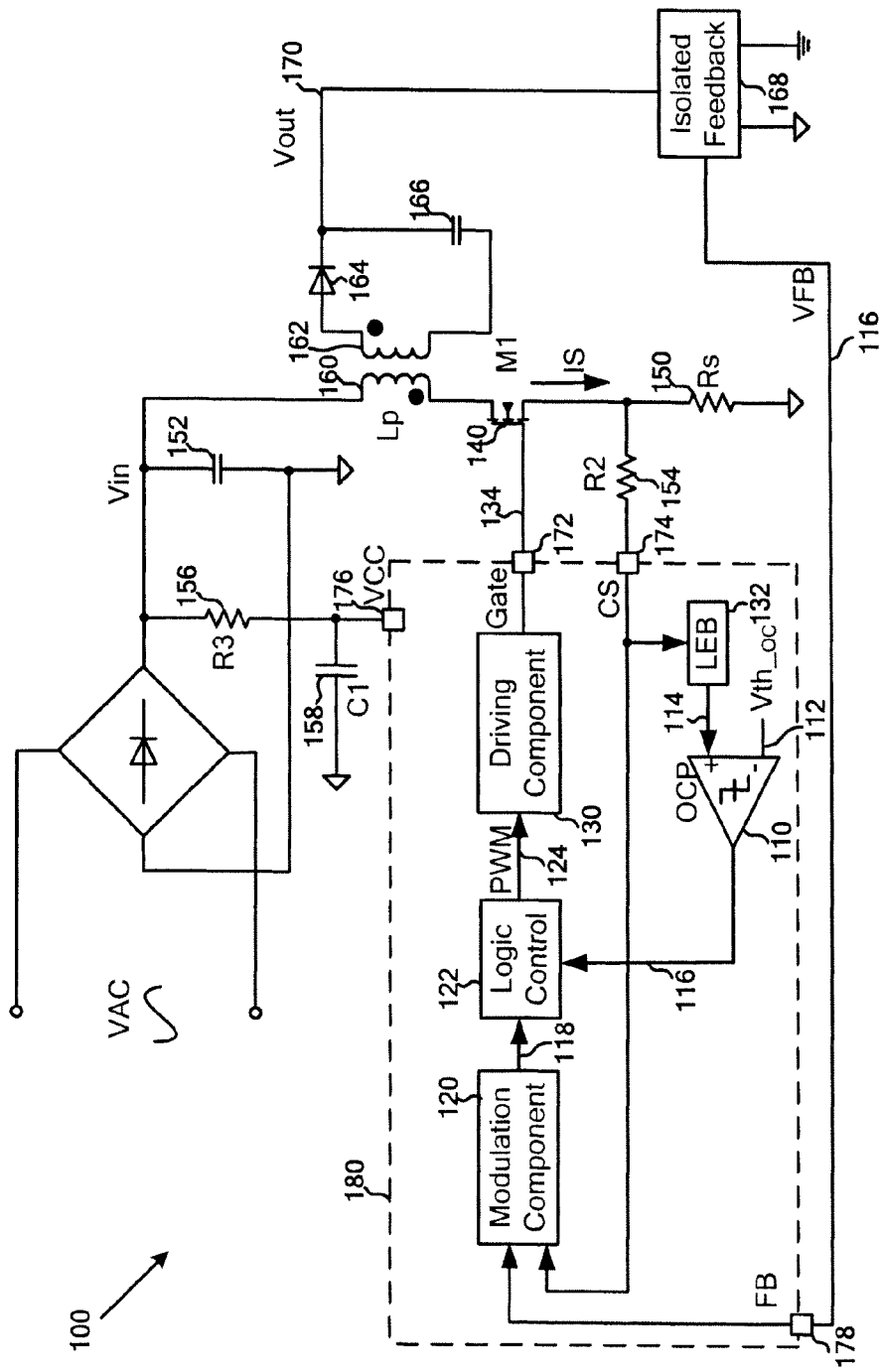
FIG. 1 is a simplified diagram showing a conventional switch-mode conversion system.
Figure 2:
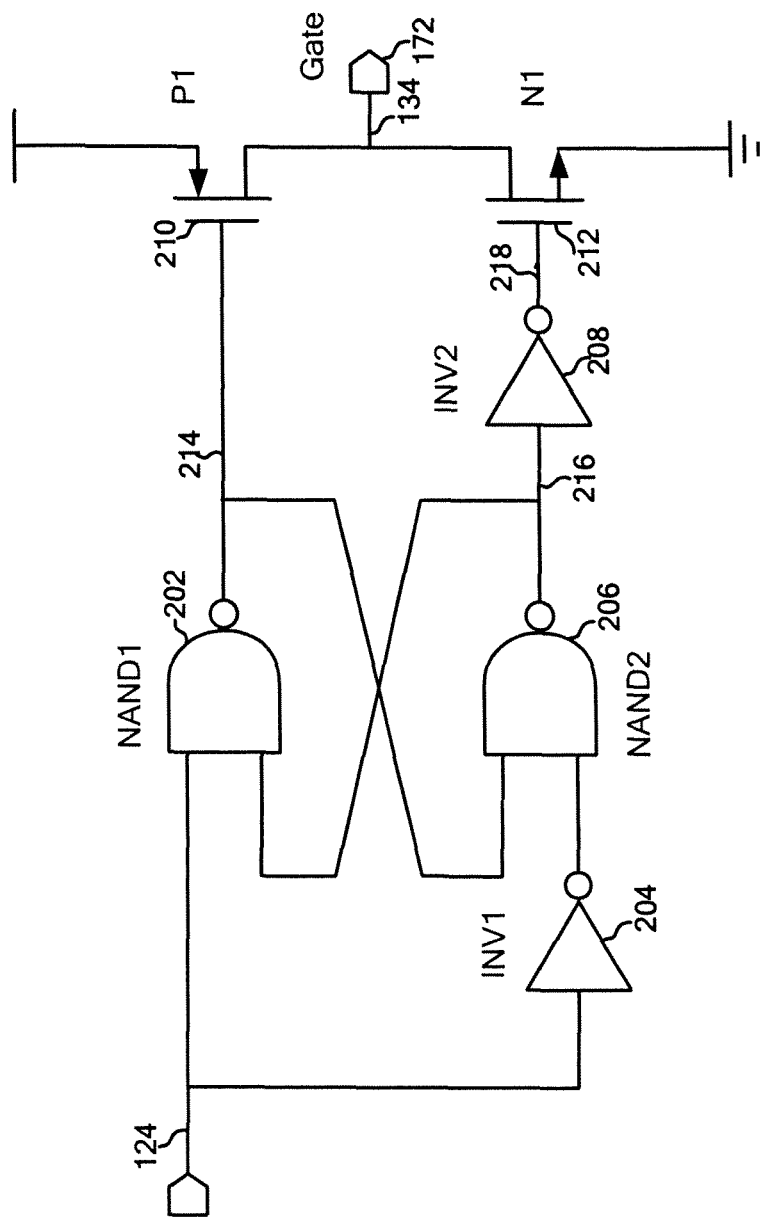
FIG. 2 is a simplified diagram showing the conventional driving component as part of the switch-mode conversion system as shown in FIG. 1.
Figure 3:
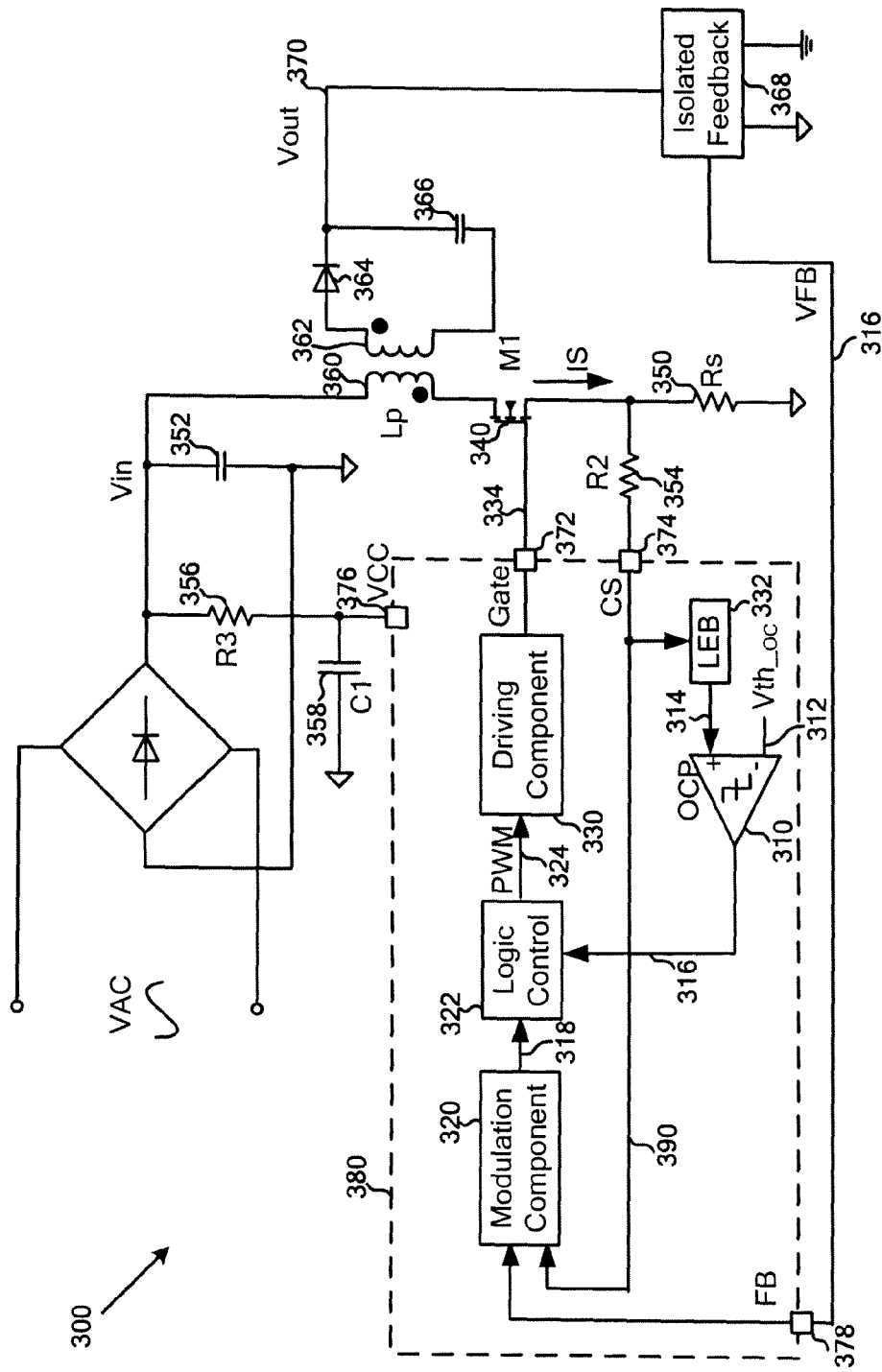
FIG. 3 is a simplified diagram showing a power conversion system according to an embodiment of the present invention.

FIG. 3 is a simplified diagram showing a power conversion system according to an embodiment of the present invention. This diagram is merely an example, which should not unduly limit the scope of the claims. One of ordinary skill in the art would recognize many variations, alternatives, and modifications. The power conversion system 300 includes a system controller 380, a switch 340, resistors 350, 354 and 356, capacitors 352, 358 and 366, a primary winding 360, a secondary winding 362, a diode 364, and an isolated feedback component 368. The system controller 380 includes a comparator 310, a modulation component 320, a logic control component 322, a driving component 330, and a LEB component 332. The system controller 380 further includes terminals 372, 374, 376, and 378.

According to one embodiment, the modulation component 320 receives a feedback signal 316 from the isolated feedback component 368 and a signal 390 from the terminal 374 (e.g., terminal CS) and generates a modulation signal 318. For example, the logic control component 322 receives the modulation signal 318 and outputs a signal 324, which is received by the driving component 330. In another example, the driving component 330 outputs a signal 334 through the terminal 372 (e.g., terminal Gate) to close (e.g., turn on) or open (e.g., turn off) the switch 340. In yet another example, the power conversion system 300 dynamically adjusts the duty cycle of the switch 340 according to the output load in order to achieve a stable output voltage 370. In yet another example, the comparator 310 receives and compares an over-current threshold signal 312 (e.g., $V_{th\_oc}$) and a current sensing signal 314 (e.g., $V_{CS}$), and sends an over-current control signal 316 to the logic control component 322. For example, when the current of the primary winding is greater than a limiting level, the logic control component 322 outputs the signal 324 in order to open (e.g., turns off) the switch 340 and shut down the power conversion system 300.

For example, when the logic control component 322 changes the signal 324 from a logic low level to a logic high level, the driving component 330 gradually increases the signal 334 in magnitude in order to slow down the turn-on process of the switch 340 to reduce EMI that results from the turn-on of the switch 340. As another example, when the logic control component 322 changes the signal 324 from the logic high level to the logic low level, the driving component 330 gradually decreases the signal 334 in magnitude in order to slow down the turn-off process of the switch 340 to reduce EMI that results from the turn-off of the switch 340.

As described above and further emphasized here, FIG. 3 is merely an example, which should not unduly limit the scope of the claims. One of ordinary skill in the art would recognize many variations, alternatives, and modifications. For example, the modulation component 320 receives the signal 314 (e.g., $V_{CS}$) from the LEB component 332, instead of the signal 390 from the terminal 374 (e.g., terminal CS).

Figure 4:
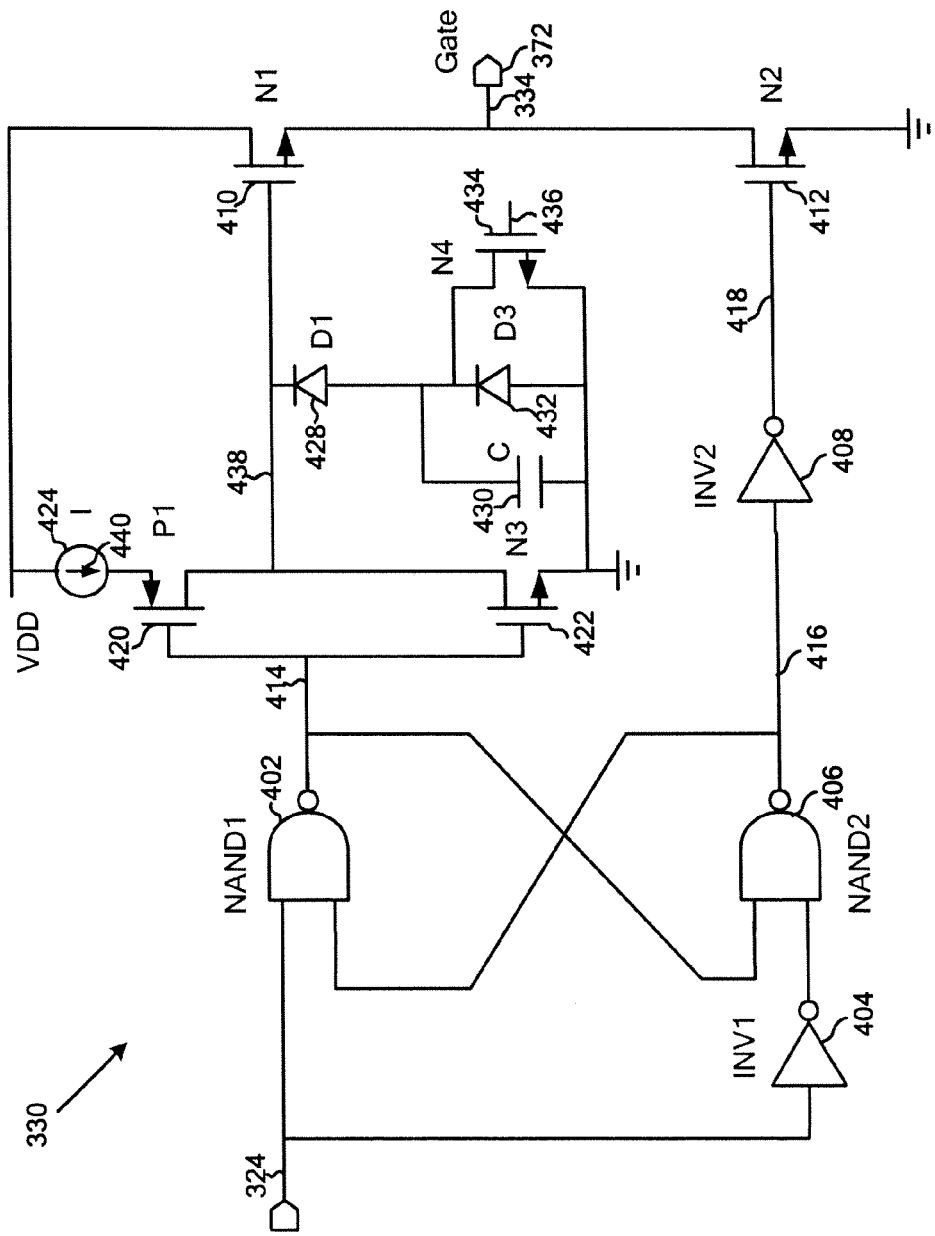
FIG. 4 is a simplified diagram showing the driving component as part of the power conversion system as shown in FIG. 3 according to an embodiment of the present invention.

FIG. 4 is a simplified diagram showing the driving component 330 as part of the power conversion system 300 according to an embodiment of the present invention. This diagram is merely an example, which should not unduly limit the scope of the claims. One of ordinary skill in the art would recognize many variations, alternatives, and modifications. The driving component 330 includes NAND gates 402 and 406, NOT gates 404 and 408, transistors 410, 412, 420, 422 and 434, a current source 424, diodes 428 and 432, and a capacitor 430. For example, the transistor 420 is a P-channel FET, and the transistors 410, 412, 422 and 434 are N-channel FETs. In another example, the diodes 428 and 432 are zener diodes.

According to one embodiment, if the signal 324 changes from a logic high level to a logic low level, a signal 414 from the NAND gate 402 changes to the logic high level, and a signal 416 from the NAND gate 406 changes to the logic low level. For example, the NOT gate 408 receives the signal 416 and outputs a signal 418 at the logic high level. In another example, the transistor 412 (e.g., N2) is turned on in response to the signal 418 being at the logic high level. In yet another example, in response to the signal 414 being at the logic high level, the transistor 420 (e.g., P1) is turned off and the transistor 422 (e.g., N3) is turned on. In yet another example, a signal 438 at a gate terminal of the transistor 410 (e.g., N1) is decreased and the transistor 410 (e.g., N1) is turned off. In yet another example, the signal 334 at the terminal 372 (e.g., terminal Gate) is at the logic low level so that the switch 340 is open (e.g., being turned off). In yet another example, the transistor 434 (e.g., N4) is turned on in response to a signal 436 which is a complementary signal of the signal 324. In yet another example, the capacitor 430 is discharged through the transistor 434. In yet another example, the signal 436 is at the logic high level when the signal 324 is at the logic low level.

According to another embodiment, if the signal 324 changes from the logic low level to the logic high level, the signal 416 from the NAND gate 406 changes to the logic high level and the signal 414 from the NAND gate 402 changes to the logic low level. For example, the NOT gate 408 outputs the signal 418 at the logic low level, and in response the transistor 412 (e.g., N2) is turned off. In another example, in response to the signal 414 being at the logic low level, the transistor 422 (e.g., N3) is turned off and the transistor 420 (e.g., P1) is turned on. In yet another example, the transistor 434 (e.g., N4) is turned off in response to the signal 436 being at the logic low level. In yet another example, the capacitor 430 is charged through the diode 428 (e.g., D1) in response to a current 440 provided by the current sourced 424. In yet another example, the signal 438 at the gate terminal of the transistor 410 (e.g., N1) increases in magnitude, and the rate of increase of the signal 438 is affected by the capacitance of the capacitor 430 and the current 440. In yet another example, in response to the increase of the signal 438, the signal 334 at the terminal 372 (e.g., terminal Gate) increases in magnitude. In yet another example, once the signal 334 reaches a predetermined magnitude, the switch 440 is closed (e.g., being turned on).

Proper adjustment of the capacitance of the capacitor 430 and the current 440 can affect the speed (e.g., di/dt, dv/dt) of closing the switch 440 so as to reduce EMI generated during the process of closing the switch 440, in some embodiments. For example, when the voltage drop on the capacitor 430 reaches a particular voltage, the zener diode 432 breaks down. In another example, the gate terminal of the transistor 410 is charged by the current 440 and the signal 438 increases in magnitude rapidly so that the period of UV overlap is reduced when the switch 440 changes from being open (e.g., being turned off) to being closed (e.g., being turned on).

Figure 5:
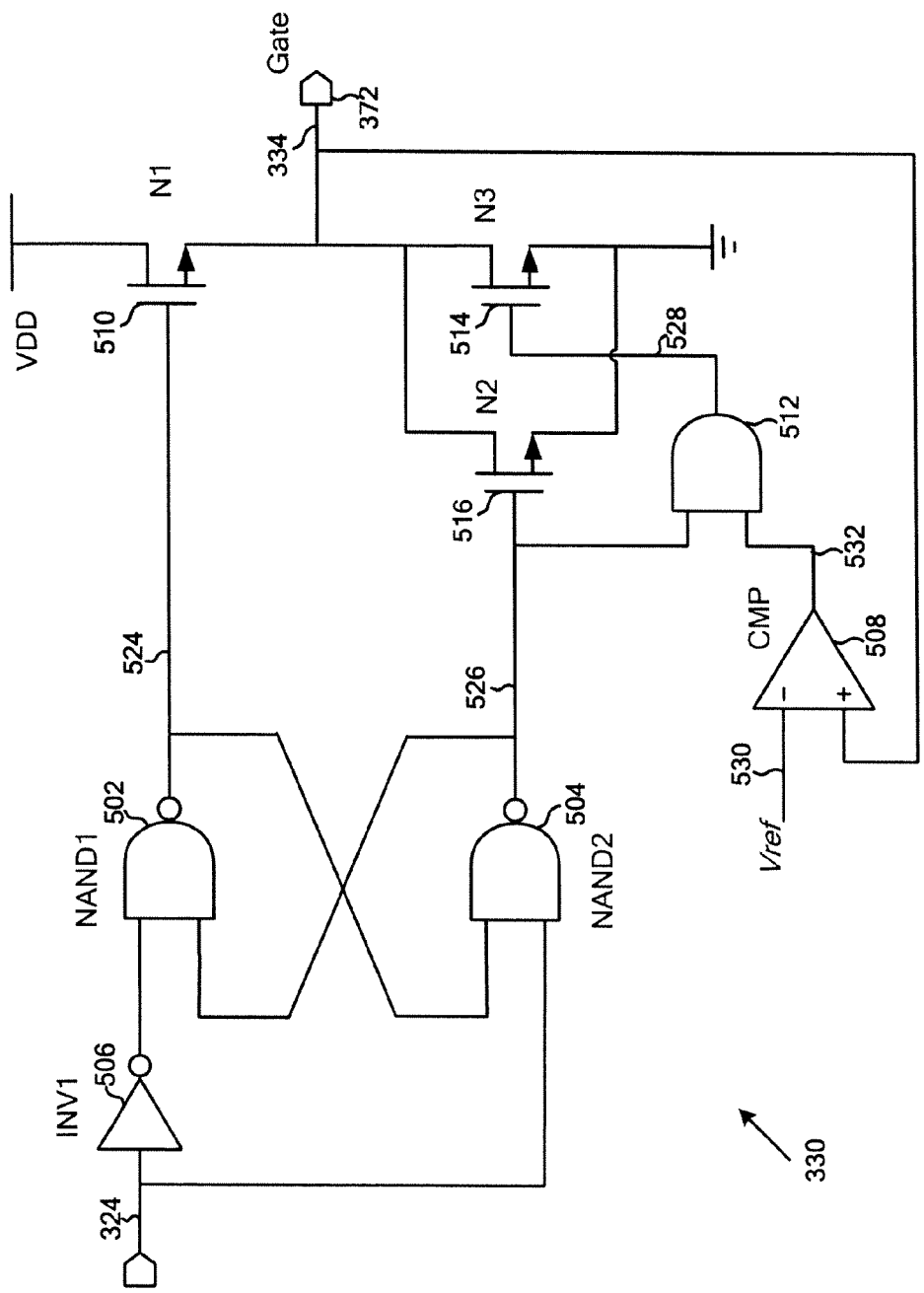
FIG. 5 is a simplified diagram showing the driving component as part of the power conversion system as shown in FIG. 3 according to another embodiment of the present invention.

FIG. 5 is a simplified diagram showing the driving component 330 as part of the power conversion system 300 according to another embodiment of the present invention. This diagram is merely an example, which should not unduly limit the scope of the claims. One of ordinary skill in the art would recognize many variations, alternatives, and modifications. The driving component 330 includes NAND gates 502 and 504, an AND gate 512, a NOT gate 506, transistors 510, 514 and 516, and a comparator 508. For example, the transistors 510, 514 and 516 are N-channel FETs.

According to one embodiment, if the signal 324 changes from the logic low level to the logic high level, a signal 524 from the NAND gate 502 changes to the logic high level, and a signal 526 from the NAND gate 504 changes to the logic low level. For example, the AND gate 512 receives the signal 526 and outputs a signal 528 at the logic low level. In another example, the transistor 510 (e.g., N1) is turned on in response to the signal 524 being at the logic high level, and the transistor 516 (e.g., N2) is turned off in response to the signal 526 being at the logic low level. In yet another example, in response to the signal 528 being at the logic low level, the transistor 514 (e.g., N3) is turned off. In yet another example, the signal 334 at the terminal 372 (e.g., terminal Gate)

changes to the logic high level so that the switch 340 changes from being open (e.g., being turned off) to being closed (e.g., being turned on).

According to another embodiment, if the signal 324 changes from the logic high level to the logic low level, the signal 526 from the NAND gate 504 changes to the logic high level and the signal 524 from the NAND gate 502 changes to the logic low level. For example, the transistor 510 (e.g., N1) is turned off in response to the signal 524 being at the logic low level, and the transistor 516 (e.g., N2) is turned on in response to the signal 526 being at the logic high level. In another example, the comparator 508 receives the signal 334 and a reference signal 530 (e.g., $V_{ref}$) and outputs a signal 532. In yet another example, if the signal 334 is larger than the reference signal 530 in magnitude, the signal 532 is at the logic high level. In yet another example, in response to the signal 528 being at the logic high level, the transistor 514 (e.g., N3) is turned on. In yet another example, the signal 334 at the terminal 372 (e.g., terminal Gate) decreases in magnitude rapidly, and the rate of decrease of the signal 334 is related to the properties (e.g., size) of the transistors 648 and 650. In yet another example, if the signal 334 becomes smaller than the reference voltage 530 in magnitude, the comparator 508 changes the signal 532 to the logic low level, and the signal 528 is changed to the logic low level. In yet another example, in response to the signal 528 being at the logic low level, the transistor 514 is turned off, and the rate of decrease of the signal 334 becomes smaller in magnitude. In yet another example, when the signal 334 decreases to a low magnitude, the switch 340 is open (e.g., being turned off). Proper adjustment of the properties (e.g., size) of the transistors 514 and 516 and the reference signal 530 can affect the speed (e.g., di/dt, dv/dt) of opening the switch 440 so as to reduce EMI generated during the process of opening (e.g., turning off) the switch 440, in some embodiments.

As described above and further emphasized here, FIG. 5 is merely an example, which should not unduly limit the scope of the claims. One of ordinary skill in the art would recognize many variations, alternatives, and modifications. For example, the comparator 508 receives and compares an input signal associated with the signal 334 with the reference signal 530. Such an input signal may be generated based on the signal 334 using a voltage divider, in some embodiments.

Figure 6:
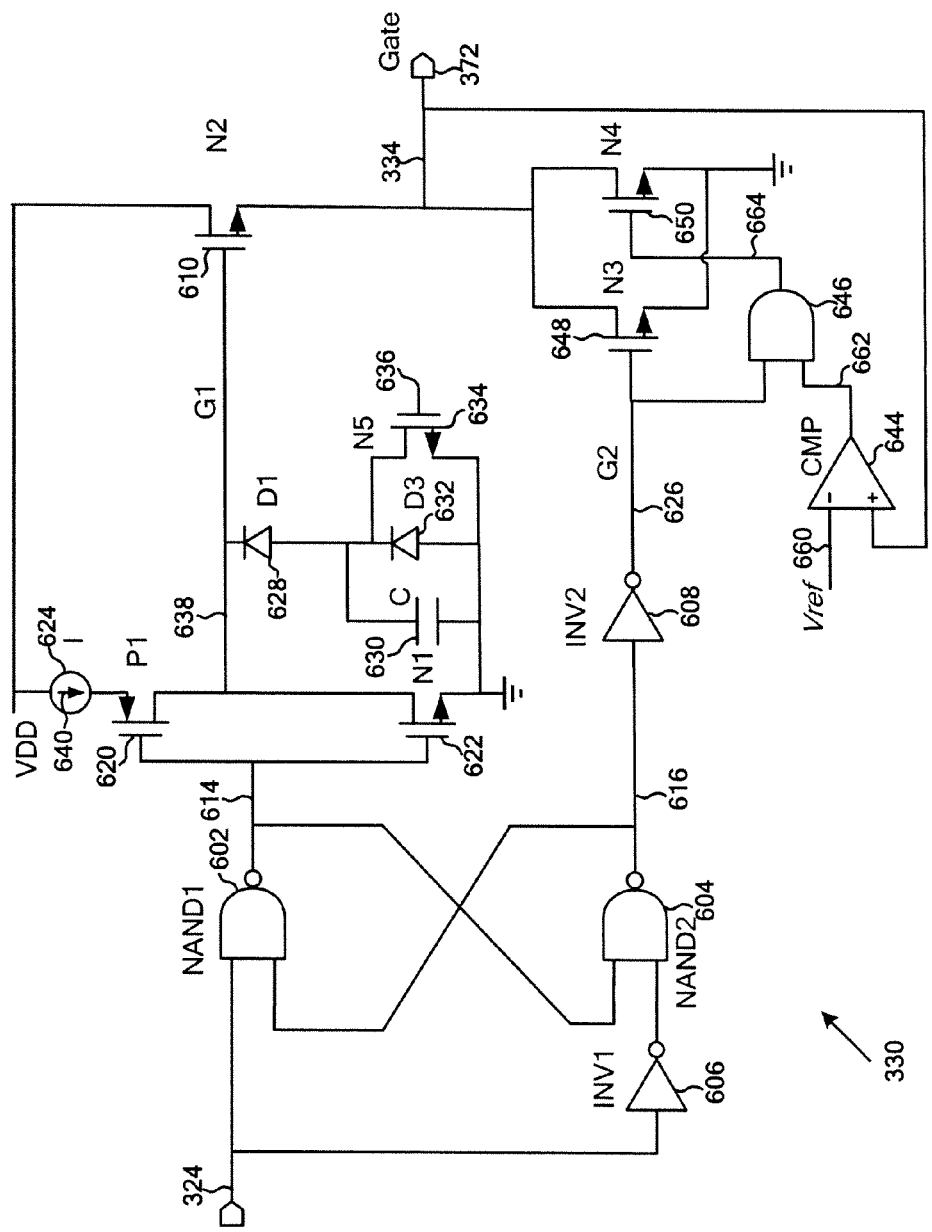
FIG. 6 is a simplified diagram showing the driving component as part of the power conversion system as shown in FIG. 3 according to yet another embodiment of the present invention.

FIG. 6 is a simplified diagram showing the driving component 330 as part of the power conversion system 300 according to yet another embodiment of the present invention. This diagram is merely an example, which should not unduly limit the scope of the claims. One of ordinary skill in the art would recognize many variations, alternatives, and modifications. The driving component 330 includes NAND gates 602 and 604, an AND gate 646, NOT gates 606 and 608, transistors 610, 620, 622, 634, 648 and 650, a current source 624, diodes 628 and 632, a capacitor 630, and a comparator 644. For example, the transistor 620 is a P-channel FET, and the transistors 610, 622, 634, 648 and 650 are N-channel FETs. In another example, the diodes 628 and 632 are zener diodes.

According to one embodiment, if the signal 324 changes from the logic high level to the logic low level, a signal 614 from the NAND gate 602 changes to the logic high level, and a signal 616 from the NAND gate 604 changes to the logic low level. For example, in response to the signal 614 being at the logic high level, the transistor 620 (e.g., P1) is turned off and the transistor 622 (e.g., N1) is turned on. In another example, a signal 638 at a gate terminal of the transistor 610 (e.g., N2) decreases and the transistor 610 is turned off. In yet another example, the transistor 634 (e.g., N5) is turned on in response to a signal 636 which is a complementary signal of the signal 324. In yet another example, the capacitor 630 is discharged through the transistor 634. In yet another example, the NOT gate 608 receives the signal 616 and outputs a signal 626 at the logic high level. In yet another example, the transistor 648 (e.g., N3) is turned on in response to the signal 626 being at the logic high level. In yet another example, the comparator 644 receives the signal 334 and a reference signal 660 (e.g., $V_{ref}$) and outputs a signal 662. In yet another example, if the signal 334 is larger than the reference signal 660 in magnitude, the signal 662 is at the logic high level. In yet another example, the AND gate 646 outputs a signal 664 at the logic high level, and in response the transistor 650 (e.g., N4) is turned on. In yet another example, the signal 334 at the terminal 372 (e.g., terminal Gate) decreases in magnitude rapidly, and the rate of decrease of the signal 334 is related to the properties of the transistors 648 and 650. In yet another example, if the signal 334 becomes smaller than the reference voltage 660 in magnitude, the comparator 644 changes the signal 662 to the logic low level, and the signal 664 is changed to the logic low level. In yet another example, in response to the signal 664 being at the logic low level, the transistor 650 (e.g., N4) is turned off, and the rate of decrease of the signal 334 becomes smaller in magnitude. In yet another example, when the signal 334 decreases to a low magnitude, the switch 340 is open (e.g., being turned off). In yet another example, the signal 636 is at the logic high level when the signal 324 is at the logic low level.

According to another embodiment, if the signal 324 changes from the logic low level to the logic high level, the signal 616 from the NAND gate 604 changes to the logic high level and the signal 614 from the NAND gate 602 changes to the logic low level. For example, the NOT gate 608 outputs the signal 626 at the logic low level, and in response the transistor 648 (e.g., N3) is turned off. In another example, the AND gate 646 outputs the signal 664 at the logic low level, and in response the transistor 650 (e.g., N4) is turned off. In yet another example, in response to the signal 614 being at the logic low level, the transistor 622 (e.g., N1) is turned off and the transistor 620 (e.g., P1) is turned on. In yet another example, the transistor 634 (e.g., N5) is turned off in response to the signal 636 being at the logic low level. In yet another example, the capacitor 630 is charged through the diode 628 (e.g., D1) in response to a current 640 provided by the current sourced 624. In yet another example, the signal 638 at the gate terminal of the transistor 610 (e.g., N2) increases in magnitude, and the rate of increase of the signal 638 is affected by the capacitance of the capacitor 630 and the current 640. In yet another example, in response to the increase of the signal 638, the signal 334 at the terminal 372 (e.g., terminal Gate) increases in magnitude. In yet another example, once the signal 334 reaches a predetermined magnitude, the switch 640 is closed (e.g., being turned on).

As described above and further emphasized here, FIG. 6 is merely an example, which should not unduly limit the scope of the claims. One of ordinary skill in the art would recognize many variations, alternatives, and modifications. For example, the comparator 644 receives and compares an input signal associated with the signal 334 with the reference signal 660. Such an input signal may be generated based on the signal 334 using a voltage divider, in some embodiments.

Figure 7:
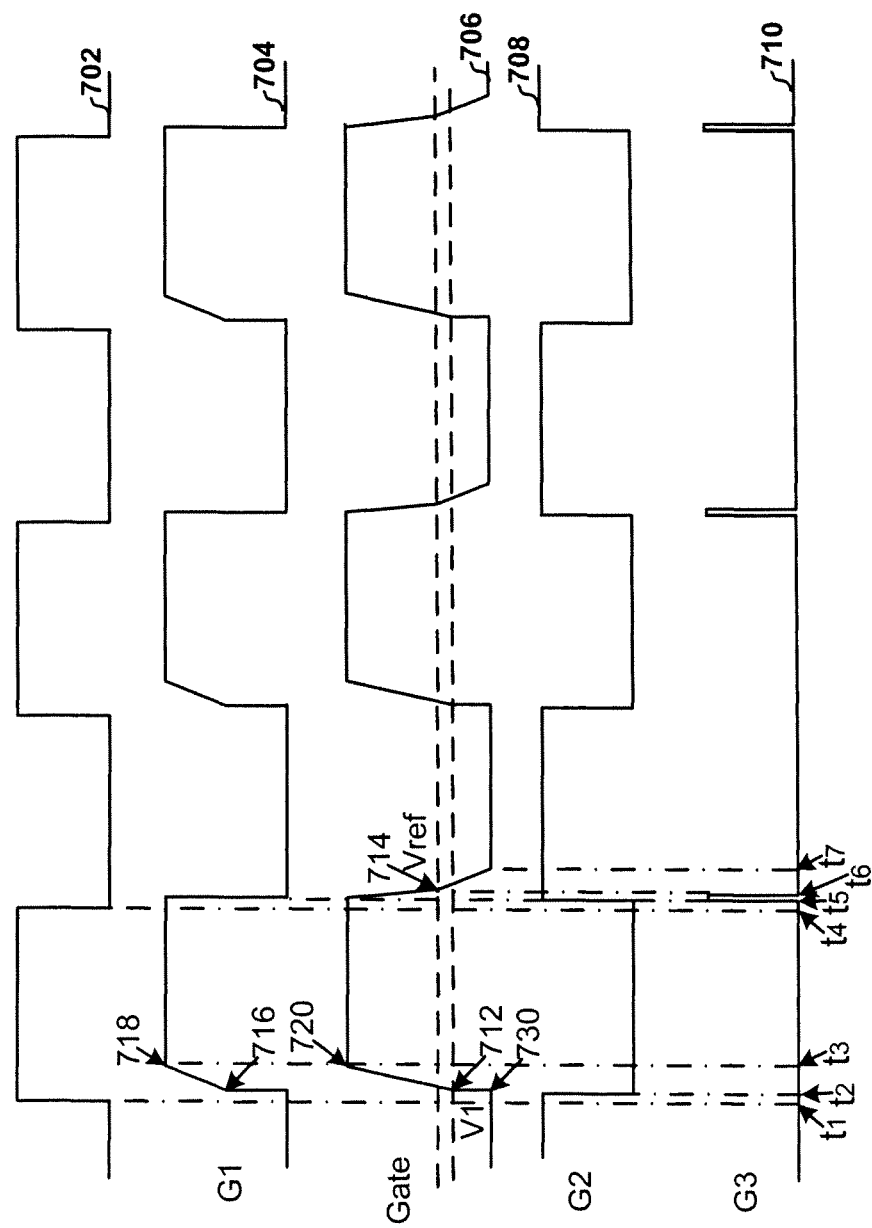
FIG. 7 is a simplified timing diagram for the power conversion system including the driving component as shown in FIG. 6 according to yet another embodiment of the present invention.

FIG. 7 is a simplified timing diagram for the power conversion system 300 including the driving component 330 as shown in FIG. 6 according to yet another embodiment of the present invention. This diagram is merely an example, which should not unduly limit the scope of the claims. One of ordinary skill in the art would recognize many variations, alternatives, and modifications. The waveform 702 represents the signal 324 as a function of time, the waveform 704 represents the signal 638 as a function of time, and the waveform 706 represents the signal 334 as a function of time. In addition, the waveform 708 represents the signal 626 as a function of time and the waveform 710 represents the signal 664 as a function of time.

According to one embodiment, at time $t_1$, the signal 324 changes from a logic low level to a logic high level (e.g., as shown by the waveform 702), the signal 616 from the NAND gate 604 changes to the logic high level and the signal 614 from the NAND gate 602 changes to the logic low level. For example, the signal 626 from the NOT gate 608 changes from the logic high level to the logic low level after a delay (e.g., at time $t_2$) as shown by the waveform 708. In another example, the signal 664 from the AND gate 646 is at the logic low level (e.g., as shown by the waveform 710). In yet another example, the transistors 648 and 650 are turned off. In yet another example, in response to the signal 614 being at the logic low level, the transistor 622 (e.g., N1) is turned off and the transistor 620 (e.g., P1) is turned on. In yet another example, the signal 638 at the gate terminal of the transistor 610 (e.g., N2) increases to a magnitude 716 (e.g., at $t_2$), and then increases to a magnitude 718 (e.g., at a slope until $t_3$) as shown by the waveform 704. In yet another example, in response to the increase of the signal 638, the signal 334 at the terminal 372 (e.g., terminal Gate) increases rapidly (e.g., at a slope $S_1$) from a magnitude 730 to a magnitude 712 (e.g., at $t_2$), and then increases to a magnitude 720 (e.g., at a slope $S_2$ between $t_2$ and $t_3$) as shown by the waveform 706. In yet another example, once the signal 334 reaches the magnitude 720, the switch 640 is closed (e.g., being turned on). In yet another example, the slope $S_1$ is larger than the slope $S_2$. In yet another example, the slope $S_1$ is very large (e.g., substantially close to infinity).

According to another embodiment, during the time period between $t_1$ and time $t_4$, the signal 324 keeps at the logic high level (e.g., as shown by the waveform 702). For example, between $t_3$ and $t_4$, the signal 638 keeps at the logic high level (e.g., as shown by the waveform 704), the signal 626 keeps at the logic low level (e.g., as shown by the waveform 708), and the signal 334 keeps at the logic high level (e.g., as shown by the waveform 706).

According to yet another embodiment, at $t_4$, the signal 324 changes to the logic low level (e.g., as shown by the waveform 702). For example, the signal 614 from the NAND gate 602 changes to the logic high level, and the signal 616 from the NAND gate 604 changes to the logic low level. In another example, in response to the signal 614 being at the logic high level, the transistor 620 (e.g., P1) is turned off and the transistor 622 (e.g., N1) is turned on. In yet another example, the signal 638 at a gate terminal of the transistor 610 (e.g., N2) decreases in magnitude after a delay (e.g., at $t_5$ as shown by the waveform 704), and the transistor 610 is turned off. In yet another example, the signal 626 from the NOT gate 608 changes to the logic high level (e.g., at $t_5$ as shown by the waveform 708), and in response the transistor 648 (e.g., N3) is turned on. In yet another example, at $t_5$, if the signal 334 (e.g., at the logic high level as shown by the waveform 706) is larger than the reference signal 660 in magnitude, the signal 662 from the comparator 644 is at the logic high level. In yet another example, the signal 664 from the AND gate 646 changes from the logic low level to the logic high level (e.g., at $t_5$ as shown by the waveform 710), and in response the transistor 650 (e.g., N4) is turned on. In yet another example, between $t_5$ and $t_6$, the signal 334 at the terminal 372 (e.g., terminal Gate) decreases in magnitude rapidly (e.g., at a slope $S_3$) from the magnitude 720 (e.g., at $t_5$) to a magnitude 714 (e.g., at $t_6$). In yet another example, after $t_6$, the signal 334 becomes smaller than the reference voltage 660 in magnitude (e.g., as shown by the waveform 706). In yet another example, the comparator 644 changes the signal 662 from the logic high level to the logic low level (e.g., at $t_6$ as shown by the waveform 710). In yet another example, in response to the signal 664 being at the logic low level, the transistor 650 (e.g., N4) is turned off. In yet another example, between $t_6$ and $t_7$, the signal 334 continues to decrease in magnitude (e.g., at a slope $S_4$) from the magnitude 714 (e.g., at $t_6$) to a low magnitude (e.g., at $t_7$) as shown by the waveform 706. In yet another example, $S_4$ is smaller than $S_3$ in magnitude.

According to another embodiment, a system controller for regulating a power conversion system includes a signal generator and a driving component. The signal generator is configured to receive a feedback signal associated with an output signal of a power conversion system and a current sensing signal associated with a primary current flowing through a primary winding of the power conversion system and generate a modulation signal based on at least information associated with the feedback signal and the current sensing signal. The driving component is configured to receive the modulation signal and output a drive signal to a switch based on at least information associated with the modulation signal. The driving component is further configured to, if the modulation signal changes from a first logic level to a second logic level, change the drive signal in magnitude from a first magnitude value to a second magnitude value during a first time period in order to close the switch, the first time period being larger than zero. For example, the system controller is implemented according to at least FIG. 3, FIG. 4, FIG. 6, and/or FIG. 7.

According to yet another embodiment, a system controller for regulating a power conversion system includes a signal generator and a driving component. The signal generator is configured to receive a feedback signal associated with an output signal of a power conversion system and a current sensing signal associated with a primary current flowing through a primary winding of the power conversion system and generate a modulation signal based on at least information associated with the feedback signal and the current sensing signal. The driving component is configured to receive the modulation signal and output a drive signal to a switch based on at least information associated with the modulation signal. The driving component is further configured to, if the modulation signal changes from a first logic level to a second logic level, change the drive signal in magnitude from a first magnitude value to a second magnitude value during a time period in order to open the switch, the time period being larger than zero. For example, the system controller is implemented according to at least FIG. 3, FIG. 5, FIG. 6, and/or FIG. 7.

According to yet another embodiment, a driving component for outputting a drive signal to a switch coupled to a primary winding of a power conversion system includes a first diode including a first diode terminal and a second diode terminal, a second diode including a third diode terminal and a fourth diode terminal, a capacitor including a first capacitor terminal and a second capacitor terminal, a current source component including a first source terminal and a second source terminal, and a first transistor including a first transistor terminal, a second transistor terminal, and a third transistor terminal. The second source terminal is coupled to the first transistor terminal. The third transistor terminal is coupled to the first diode terminal. The second diode terminal is coupled to the third diode terminal and the first capacitor terminal. The second capacitor terminal is coupled to the fourth diode terminal. For example, the system controller is implemented according to at least FIG. 4 and/or FIG. 6.

According to yet another embodiment, a driving component for outputting a drive signal to a switch coupled to a primary winding of a power conversion system includes, an AND gate component including a first input terminal, a second input terminal and a first output terminal, a comparator including a third input terminal, a fourth input terminal and a second output terminal, a first transistor including a first transistor terminal, a second transistor terminal and a third transistor terminal, and a second transistor including a fourth transistor terminal, a fifth transistor terminal and a sixth transistor terminal. The first transistor terminal is coupled to the first input terminal. The second transistor terminal is coupled to the fifth transistor terminal. The third transistor terminal is coupled to the sixth transistor terminal. The fourth transistor terminal is coupled to the first output terminal. The second output terminal is coupled to the second input terminal. For example, the system controller is implemented according to at least FIG. 5 and/or FIG. 6.

In one embodiment, a method for regulating a power conversion system includes, receiving a feedback signal associated with an output signal of a power conversion system and a current sensing signal associated with a primary current flowing through a primary winding of the power conversion system, processing information associated with the feedback signal and the current sensing signal, and generating a modulation signal based on at least information associated with the feedback signal and the current sensing signal. Further, the method includes receiving the modulation signal, processing information associated with the modulation signal, and outputting a drive signal to a switch based on at least information associated with the modulation signal. The process for outputting a drive signal to a switch based on at least information associated with the modulation signal includes, if the modulation signal changes from a first logic level to a second logic level, changing the drive signal in magnitude from a first magnitude value to a second magnitude value during a time period in order to close the switch, the time period being larger than zero. For example, the method is implemented according to at least FIG. 3, FIG. 4, FIG. 6, and/or FIG. 7.

In another embodiment, a method for regulating a power conversion system includes, receiving a feedback signal associated with an output signal of a power conversion system and a current sensing signal associated with a primary current flowing through a primary winding of the power conversion system, processing information associated with the feedback signal and the current sensing signal, and generating a modulation signal based on at least information associated with the feedback signal and the current sensing signal. Further, the method includes, receiving the modulation signal, processing information associated with the modulation signal, and outputting a drive signal to a switch based on at least information associated with the modulation signal. The process for outputting a drive signal to a switch based on at least information associated with the modulation signal includes, if the modulation signal changes from a first logic level to a second logic level, changing the drive signal in magnitude from a first magnitude value to a second magnitude value during a time period in order to open the switch, the time period being larger than zero. For example, the system controller is implemented according to at least FIG. 3, FIG. 5, FIG. 6, and/or FIG. 7.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system controller for regulating a power conversion system, the system controller comprising:
    a signal generator configured to receive a feedback signal associated with an output signal of the power conversion system and a current sensing signal associated with a primary current flowing through a primary winding of the power conversion system and generate a modulation signal based on at least information associated with the feedback signal and the current sensing signal; and
    a driving component configured to receive the modulation signal and output a drive signal to a switch based on at least information associated with the modulation signal;
    wherein the driving component is further configured to, if the modulation signal changes from a first logic level to a second logic level, change the drive signal in magnitude from a first magnitude value to a second magnitude value during a first time period in order to close the switch, the first time period being larger than zero;
    wherein:
        the driving component is further configured to, if the modulation signal changes from the first logic level to the second logic level, change the drive signal in magnitude from the first magnitude value to a third magnitude value at a first slope with respect to time and change the drive signal in magnitude from the third magnitude value to the second magnitude value at a second slope with respect to time;
        the second slope is smaller than the first slope in magnitude; and
        the third magnitude value is larger than the first magnitude value and smaller than the second magnitude value.

2. The system controller of claim 1 wherein the signal generator includes:
    a modulation component configured to receive the feedback signal and generate a first signal based on at least information associated with the feedback signal; and
    a logic control component configured to receive the first signal and output the modulation signal based on at least information associated with the first signal.

3. The system controller of claim 1 wherein the first slope is equal substantially to infinity.

4. The system controller of claim 1 wherein the first logic level corresponds to a logic low level, and the second logic level corresponds to a logic high level.

5. A system controller for regulating a power conversion system, the system controller comprising:
    a signal generator configured to receive a feedback signal associated with an output signal of the power conversion system and a current sensing signal associated with a primary current flowing through a primary winding of the power conversion system and generate a modulation signal based on at least information associated with the feedback signal and the current sensing signal; and a driving component configured to receive the modulation signal and output a drive signal to a switch based on at least information associated with the modulation signal;

wherein the driving component is further configured to, if the modulation signal changes from a first logic level to a second logic level, change the drive signal in magnitude from a first magnitude value to a second magnitude value during a first time period in order to close the switch, the first time period being larger than zero;

wherein the driving component is further configured to, if the modulation signal changes from the second logic level to the first logic level, change the drive signal in magnitude from a third magnitude value to a fourth magnitude value during a second time period in order to open the switch, the second time period being larger than zero.

6. The system controller of claim 5 wherein:

the driving component is further configured to, if the modulation signal changes from the second logic level to the first logic level, change the drive signal in magnitude from the third magnitude value to a fifth magnitude value at a first slope with respect to time and change the drive signal in magnitude from the fifth magnitude value to the fourth magnitude value at a second slope with respect to time;

the second slope is smaller than the first slope in magnitude; and the fifth magnitude value is larger than the fourth magnitude value and smaller than the third magnitude value.

7. The system controller of claim 5 wherein the signal generator includes:

a modulation component configured to receive the feedback signal and generate a first signal based on at least information associated with the feedback signal; and a logic control component configured to receive the first signal and output the modulation signal based on at least information associated with the first signal.

8. The system controller of claim 5 wherein the first logic level corresponds to a logic low level, and the second logic level corresponds to a logic high level.

9. The system controller of claim 5 wherein the third magnitude value is equal to the second magnitude value.

10. A system controller for regulating a power conversion system, the system controller comprising:

a signal generator configured to receive a feedback signal associated with an output signal of the power conversion system and a current sensing signal associated with a primary current flowing through a primary winding of the power conversion system and generate a modulation signal based on at least information associated with the feedback signal and the current sensing signal; and a driving component configured to receive the modulation signal and output a drive signal to a switch based on at least information associated with the modulation signal;

wherein the driving component is further configured to, if the modulation signal changes from a first logic level to a second logic level, change the drive signal in magnitude from a first magnitude value to a second magnitude value during a time period in order to open the switch, the time period being larger than zero;

wherein:

the driving component is further configured to, if the modulation signal changes from the first logic level to the second logic level, change the drive signal in magnitude from the first magnitude value to a third magnitude value at a first slope with respect to time and change the drive signal in magnitude from the third magnitude value to the second magnitude value at a second slope with respect to time;

the second slope is smaller than the first slope; and the third magnitude value is smaller than the first magnitude value and larger than the second magnitude value.

11. The system controller of claim 10 wherein the first slope is equal substantially to infinity.

12. The system controller of claim 10 wherein the first logic level corresponds to a logic high level, and the second logic level corresponds to a logic low level.

13. A driving component for outputting a drive signal to a switch coupled to a primary winding of a power conversion system, the driving component comprising:

a first diode including a first diode terminal and a second diode terminal;

a second diode including a third diode terminal and a fourth diode terminal;

a capacitor including a first capacitor terminal and a second capacitor terminal;

a current source component including a first source terminal and a second source terminal;

a first transistor including a first transistor terminal, a second transistor terminal, and a third transistor terminal;

a second transistor including a fourth transistor terminal, a fifth transistor terminal and a sixth transistor terminal; and a third transistor including a seventh transistor terminal, an eighth transistor terminal and a ninth transistor terminal;

wherein:

the second source terminal is coupled to the first transistor terminal;

the third transistor terminal is coupled to the first diode terminal;

the second diode terminal is coupled to the third diode terminal and the first capacitor terminal; and the second capacitor terminal is coupled to the fourth diode terminal;

wherein:

the fourth transistor terminal is coupled to the first transistor terminal;

the fifth transistor terminal is coupled to the third transistor terminal;

the sixth transistor terminal is coupled to the second capacitor terminal;

the eighth transistor terminal is coupled to the third diode terminal; and the ninth transistor terminal is coupled to the fourth diode terminal.

14. The driving component of claim 13, and further comprising:

a fourth transistor including a tenth transistor terminal, an eleventh transistor terminal and a twelfth transistor terminal;

wherein the tenth transistor terminal is coupled to the third transistor terminal and the fifth transistor terminal.

15. The driving component of claim 13, and further comprising:

an AND gate component including a first input terminal, a second input terminal and a first output terminal;

a comparator including a third input terminal, a fourth input terminal and a second output terminal;

a fourth transistor including a tenth transistor terminal, an eleventh transistor terminal and a twelfth transistor terminal; and a fifth transistor including a thirteenth transistor terminal, a fourteenth transistor terminal and a fifteenth transistor terminal;

wherein:
the tenth transistor terminal is coupled to the first input terminal;
the eleventh transistor terminal is coupled to the fourteenth transistor terminal;
the twelfth transistor terminal is coupled to the fifteenth transistor terminal;
the thirteenth transistor terminal is coupled to the first output terminal; and
the second output terminal is coupled to the second input terminal.

16. The driving component of claim 15 wherein:
the third input terminal is configured to receive a reference signal; and
the fourth input terminal is configured to receive a first signal associated with the drive signal.

17. The driving component of claim 16 wherein the first signal is proportional to the drive signal in magnitude.

18. The driving component of claim 17 wherein the first signal is the drive signal.

19. The driving component of claim 15 wherein the fourth input terminal is coupled to the eleventh transistor terminal and the fourteenth transistor terminal.

20. The driving component of claim 15, and further comprising:
a sixth transistor including a sixteenth transistor terminal, a seventeenth transistor terminal and an eighteenth transistor terminal;
wherein the eighteenth transistor terminal is coupled to the eleventh transistor terminal and the fourteenth transistor terminal.

21. A method for regulating a power conversion system, the method comprising:
receiving a feedback signal associated with an output signal of the power conversion system and a current sensing signal associated with a primary current flowing through a primary winding of the power conversion system;
processing information associated with the feedback signal and the current sensing signal;
generating a modulation signal based on at least the information associated with the feedback signal and the current sensing signal;
receiving the modulation signal;
processing information associated with the modulation signal; and
outputting a drive signal to a switch based on at least the information associated with the modulation signal;
wherein the outputting the drive signal to the switch based on at least the information associated with the modulation signal includes, if the modulation signal changes from a first logic level to a second logic level, changing the drive signal in magnitude from a first magnitude value to a second magnitude value during a time period in order to close the switch, the time period being larger than zero;
wherein:
the outputting the drive signal to the switch based on at least the information associated with the modulation signal further includes, if the modulation signal changes from the first logic level to the second logic level, changing the drive signal in magnitude from the first magnitude value to a third magnitude value at a first slope with respect to time; and
changing the drive signal in magnitude from the third magnitude value to the second magnitude value at a second slope with respect to time;
the second slope is smaller than the first slope in magnitude; and
the third magnitude value is larger than the first magnitude value and smaller than the second magnitude value.

22. The method of claim 21 wherein the first slope is equal substantially to infinity.

23. The method of claim 21 wherein the first logic level corresponds to a logic low level, and the second logic level corresponds to a logic high level.

24. A method for regulating a power conversion system, the method comprising:
receiving a feedback signal associated with an output signal of the power conversion system and a current sensing signal associated with a primary current flowing through a primary winding of the power conversion system;
processing information associated with the feedback signal and the current sensing signal;
generating a modulation signal based on at least the information associated with the feedback signal and the current sensing signal;
receiving the modulation signal;
processing information associated with the modulation signal; and
outputting a drive signal to a switch based on at least the information associated with the modulation signal;
wherein the outputting the drive signal to the switch based on at least the information associated with the modulation signal includes, if the modulation signal changes from a first logic level to a second logic level, changing the drive signal in magnitude from a first magnitude value to a second magnitude value during a first time period in order to close the switch, the first time period being larger than zero;
wherein the outputting the drive signal to the switch based on at least the information associated with the modulation signal further includes, if the modulation signal changes from the second logic level to the first logic level, changing the drive signal in magnitude from a third magnitude value to a fourth magnitude value during a second time period in order to open the switch, the second time period being larger than zero.

25. The method of claim 24 wherein the third magnitude value is equal to the second magnitude value.

26. The method of claim 24 wherein:
the outputting the drive signal to the switch based on at least the information associated with the modulation signal further includes, if the modulation signal changes from the second logic level to the first logic level,
changing the drive signal in magnitude from the third magnitude value to a fifth magnitude value at a first slope with respect to time; and
changing the drive signal in magnitude from the fifth magnitude value to the fourth magnitude value at a second slope with respect to time;
the second slope is smaller than the first slope in magnitude; and
the fifth magnitude value is larger than the fourth magnitude value and smaller than the third magnitude value.

27. The method of claim 24 wherein the first logic level corresponds to a logic low level, and the second logic level corresponds to a logic high level.

28. A method for regulating a power conversion system, the method comprising:

receiving a feedback signal associated with an output signal of the power conversion system and a current sensing signal associated with a primary current flowing through a primary winding of the power conversion system;

processing information associated with the feedback signal and the current sensing signal;

generating a modulation signal based on at least the information associated with the feedback signal and the current sensing signal;

receiving the modulation signal;

processing information associated with the modulation signal; and outputting a drive signal to a switch based on at least the information associated with the modulation signal;

wherein the outputting the drive signal to the switch based on at least the information associated with the modulation signal includes, if the modulation signal changes from a first logic level to a second logic level, changing the drive signal in magnitude from a first magnitude value to a second magnitude value during a time period in order to open the switch, the time period being larger than zero;

wherein:

the outputting the drive signal to the switch based on at least the information associated with the modulation signal further includes, if the modulation signal changes from the first logic level to the second logic level, changing the drive signal in magnitude from the first magnitude value to a third magnitude value at a first slope with respect to time; and changing the drive signal in magnitude from the third magnitude value to the second magnitude value at a second slope with respect to time;

the second slope is smaller than the first slope; and the third magnitude value is smaller than the first magnitude value and larger than the second magnitude value.

29. The method of claim 28 wherein the first slope is equal substantially to infinity.

30. The method of claim 28 wherein the first logic level corresponds to a logic high level, and the second logic level corresponds to a logic low level.

* * * * *